United States Patent [19]
Passow

[11] 3,952,255
[45] Apr. 20, 1976

[54] LINEAR ACCELERATION SYSTEM FOR HIGH ENERGY ELECTRONS WITH PREACCELERATION AND MAIN ACCELERATION MEANS

[75] Inventor: Cord Passow, Neuthard, Germany

[73] Assignee: Gesellschaft fur Kernforschung m.b.H., Karlsruhe, Germany

[22] Filed: Oct. 30, 1974

[21] Appl. No.: 519,198

[30] Foreign Application Priority Data
Nov. 3, 1973   Germany............................ 2355102

[52] U.S. Cl. ............................................... 328/233
[51] Int. Cl.². ..................... H01J 25/00; H05H 9/00
[58] Field of Search ............. 328/227, 233; 313/360

[56] References Cited
UNITED STATES PATENTS

| | | | |
|---|---|---|---|
| 3,333,142 | 7/1967 | Takeda et al. .................. | 328/233 X |
| 3,489,943 | 1/1970 | Denholm ........................ | 328/233 X |
| 3,489,944 | 1/1970 | Denholm et al. ................ | 328/227 X |

Primary Examiner—Palmer C. Demeo
Attorney, Agent, or Firm—Spencer & Kaye

[57] ABSTRACT

A linear acceleration system composed of a high energy field emission source and two linear accelerators connected in sequence to accelerate electrons emitted by the source, the first accelerator shifting the electron pulses from the source by 180° relative to phase and the second accelerator accelerating the electrons in a pulse whose energies differ from the lowest energy electrons by an amount which is less than the acceleration imparted to the lowest energy electrons and which differs therefrom by an amount proportional to such energy difference, whereby the electrons at the output of the second accelerator have a highly uniform energy level.

6 Claims, 5 Drawing Figures

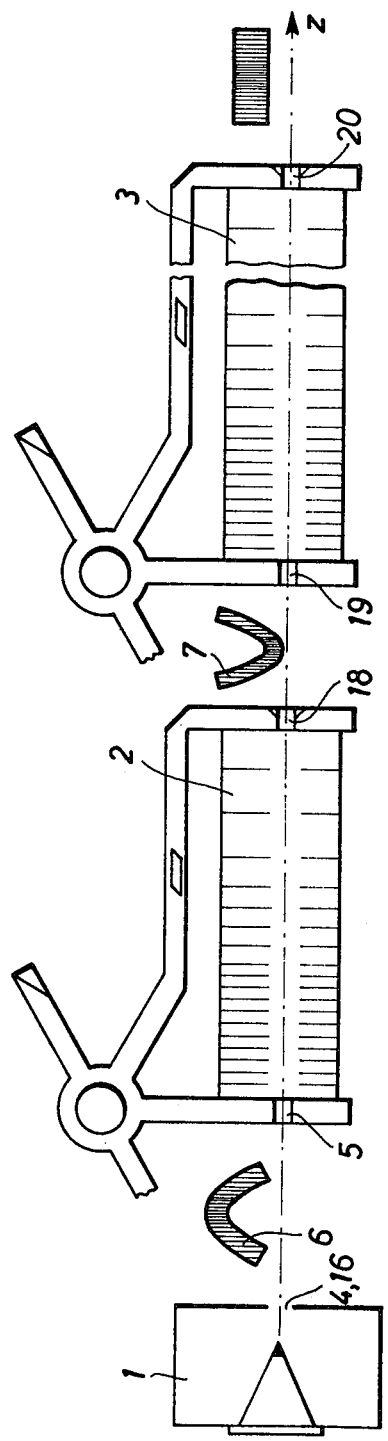

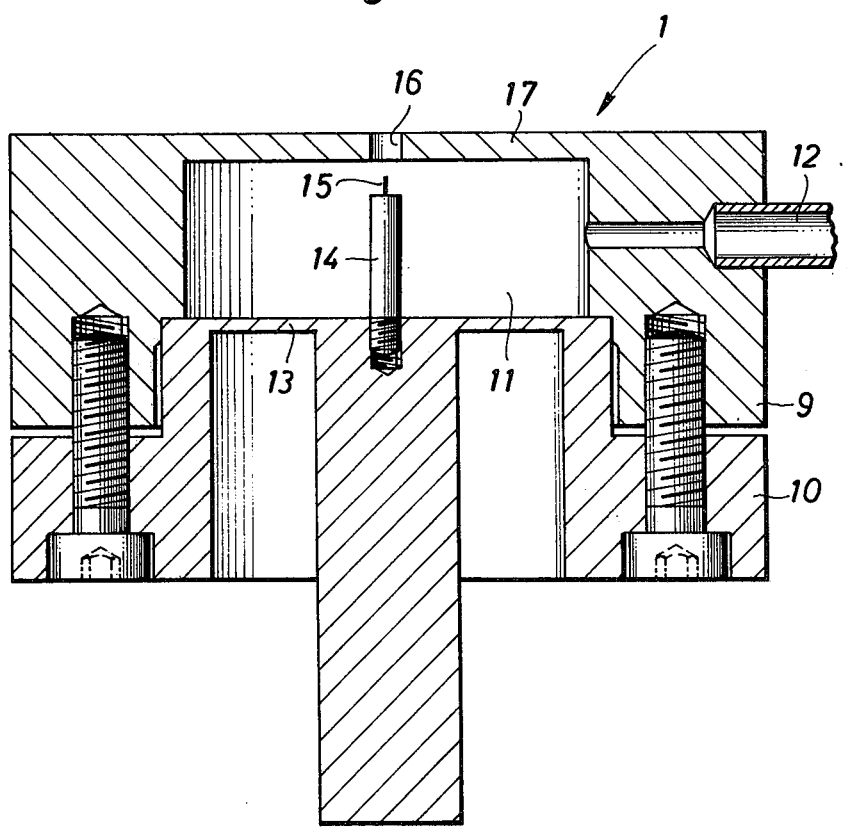

LINEAR ACCELERATION SYSTEM FOR HIGH ENERGY ELECTRONS WITH PREACCELERATION AND MAIN ACCELERATION MEANS

BACKGROUND OF THE INVENTION

The present invention relates to a linear acceleration system for producing high energy electrons with a highly constant, or uniform, energy level and beam direction.

Accelerators which bring electrons to high energy are required, inter alia, for electron microscopes. Accelerators, such as those disclosed by G. Reinhold, in IEEE Transactions on Nuclear Science, June 1967, Vol. NS-14, No. 3, are known in which high acceleration voltages (750 kev to 1.5 Mev) are produced by electrostatic generators with or without pressure tanks. These devices would, however, have to be extremely large to produce energies above 1 Mev and the resulting construction costs are very high and would be considerably greater when higher acceleration voltages are required.

The use of high frequency linear accelerators as voltage sources has already been proposed, for example as disclosed by D. Klema, ANL 7275, Proceedings of the Amu Anl Workshop on High Voltage Electron Microscopy, Argonne Laboratory, June 13th – July 15th, 1966. In this linear accelerator appropriately shaped cavity resonators produce high frequency fields so that the waves travel along a prescribed axis with a selected phase velocity and produce a field in the direction of this axis. This field may be the Fourier component of a complicated field distribution. The particles are injected into the field at the proper time from an electrostatic source and always encounter an electric field in their flight path. Thus they are correspondingly accelerated. The use of electrostatic sources has the drawback, however, that the energy resolution is poor and the brightness of the source is insufficient since a chopper or the like must be disposed between the source and the acceleration system following thereafter in order to produce a pulsed current from the electron current arriving as a direct current.

SUMMARY OF THE INVENTION

It is an object of the present invention to provide an acceleration system for up to 10 Mev electrons which furnishes a sufficiently high energy constancy with sufficiently high directional beam values and/or furnishes a pulsed beam.

This and other objects of the invention are accomplished by a system including a high frequency field emission source as the source of pulsed electron beams, a preaccelerator connected behind this high frequency emission source and having an operating frequency which is less than the operating frequency of the source and with a length and acceleration fields of such dimensions that the distribution of the electrons in the phase space during the acceleration is shifted by a multiple of 180°, which multiple may be unity, until they reach the output of the preaccelerator, and a main accelerator following the preaccelerator and of a length and with acceleration fields of such dimensions that the electrons which exhibit a deviation in energy when they are injected into the main accelerator will be accelerated to a lesser degree amounting to the difference between their energy and that of the electrons with minimum energy.

According to one advantageous embodiment of the present invention, the shift in phase for the distribution of the electrons in the preaccelerator is effected by injecting the centers of mass of the electron pulses into the preaccelerator with a phase unequal to zero with respect to the wave maximum of the acceleration wave.

According to a special embodiment of the invention, the centers of mass of the electron pulses from the preaccelerator can be injected into the main accelerator with a zero phase with respect to the maximum of the acceleration wave of the main accelerator and the electrons maintain this phase position in the main accelerator.

Embodiments of the invention include a high frequency field emission source which operates at an operating frequency of 24 GHz, while the preaccelerator and the main accelerator operate at an operating frequency of 3 GHz.

In further embodiments of the linear acceleration system according to the invention, in order to reduce the energy to be produced and in order to realize greater field stabilities, the inner walls of the high frequency field emission source and of the preaccelerator and main accelerator are made of a superconductive material or are covered with a superconductive material.

The particular advantages of the present invention lie in that the brightness is increased by the use of a high frequency field emission source. The energy constancy is kept high and energy distribution in the beam kept low by adapting the source to the acceleration system and by the special design of the accelerator. Thus the most significant drawbacks of high frequency accelerators as voltage sources are eliminated. The linear accelerator according to the present invention becomes smaller and less expensive with respect to manufacturing and housing costs. It can be installed in any normal-sized laboratory. Additionally, in certain cases a pulsed beam can be better processed electron optically since chromatic and spherical errors can be corrected, for example, with the use of high frequency lenses and the operating energy for electron microscopes can be expanded to the range between 5 and 10 Mev. The brightness is defined as the current per area and the solid angle. The value of $4 \times 10^7$ A/ [cm$^2$ sr] is achievable.

BRIEF DESCRIPTION OF THE DRAWING

FIG. 1 is a schematic cross-sectional view of an acceleration system according to the invention.

FIG. 3 is a cross-sectional view of a high frequency field emission source according to the invention.

DESCRIPTION OF THE PREFERRED EMBODIMENTS

FIG. 1 is a schematic illustration of an acceleration system according to the invention substantially including a high frequency field emission source 1, a preaccelerator 2 and a main accelerator 3 which are arranged one behind the other along an axis, here designated as the $z$ axis of an $x$, $y$, $z$ orthogonal system. All three parts are included in a vacuum system which is not shown in detail and which may be externally cooled.

Figure 2A:
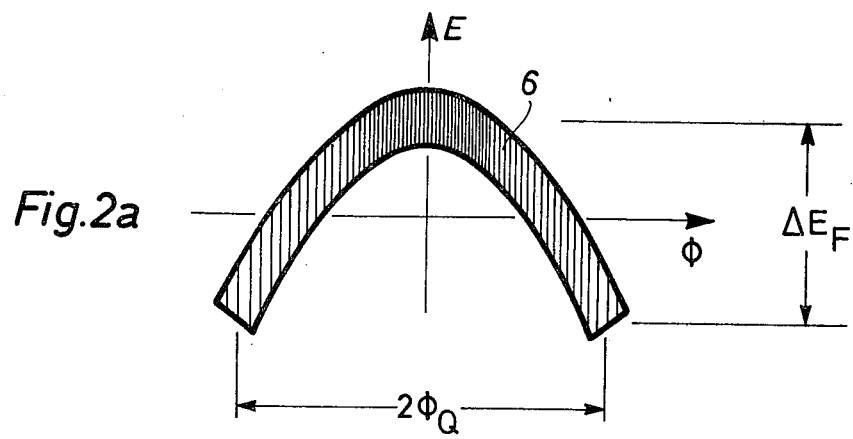
FIGS. 2a to 2c are pictorial representations of the time distribution of the energy of the electron beam after the source (FIG. 2a), after the preaccelerator (FIG. 2b) and after the main accelerator (FIG. 2c).

The high frequency field emission source 1 is a source which will be described in detail in connection with FIG. 3. Its operating frequency is at 24 GHz. The phase vs. energy characteristic 6 of the electrons emerging from opening 4 is schematically illustrated in the region between source 1 and the preaccelerator 2, and is also shown in FIG. 2a.

At not too great a distance from source 1 there is disposed the preaccelerator 2 having an entrance aperture 5 with a diameter of the order of magnitude of 1 mm. The preaccelerator 2 and the main accelerator 3 may be operated with traveling waves, as illustrated, or as resonators.

In order to increase the quality of all three components 1 to 3, the inner walls may be made of a superconductive material, or the parts themselves may be made of a superconductive material. The preaccelerator 2 has a length of about 120 cm and accelerates the electrons to a maximum of 3 MeV/m. The operating frequency of the preaccelerator and that of the main accelerator is at 3 GHz. The diameter of the preaccelerator and of the main accelerator is about 20 cm. The length of the main accelerator 3 is about 60 cm and its acceleration rate is 3 MeV/m.

The current source is, for example, a superconductive high frequency field emission source 1 which produces pulsed electron beams that can be used in an electron microscope (not shown). The electron beam 6 contains electrons which have, in dependence on their phase, $\phi$, with respect to the high frequency $f_Q$ of the source, an energy distribution $\Delta E_F$ of up to 6 percent. This relation between the phase $\phi$ and the energy E is illustrated in FIG. 2a. In this illustration the electron distribution is also shown by a variable darkening. The pulse has a width of about 40° which corresponds to a phase width of $2\phi_Q$. Here a phase of 360° corresponds to a full period of the operation frequency.

In order to reduce this phase width $2\phi_Q$, the preaccelerator 2 following the source, and the main accelerator 3 are operated at a lower frequency (3 GHz) than the source 1 (24 GHz). Thus the non-harmonic oscillations of the particles, i.e. electrons in the phase space which would interfere with the process to be described below are reduced.

The preaccelerator 2 must have such dimensions, with regard to its length and the excited acceleration fields, that the electron distribution 6 is rotated in the phase space by 180°, or a multiple thereof, during acceleration. This is accomplished by injecting the center of mass of each pulse 6 at a phase, with respect to the wave maximum, which is unequal to zero. A prerequisite is that the phase oscillation frequency is the same for all particles.

Figure 2B:
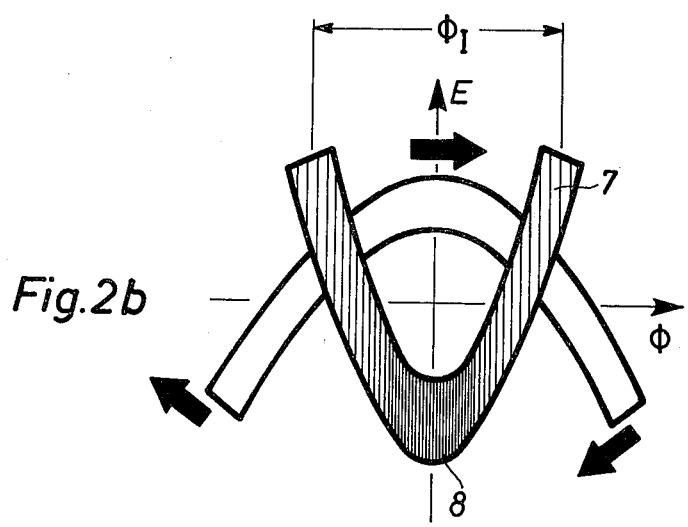

This results in a phase distribution E vs. $\phi$ which is shown schematically in FIG. 1, between the preaccelerator 2 and the main accelerator 3, and which is shown in detail in FIG. 2b, as pulse, or phase distribution, 7. Also shown is the phase distribution 6 of FIG. 2a and, indicated by arrows, the direction of rotation thereof. The new pulse, or phase distribution, 7 has a phase width $\phi_I$ which is less than $2\phi_Q$. The distribution of the electrons within pulse 7 is again shown by varying shading or hatching; at the minimum 8 there is a high electron density.

In order to obtain, for example, such a shift by 180° or a multiple thereof, respectively, in the phase space, conditions 1 and 2 must be met.

Condition 1

$$\sqrt{1 - \frac{1}{4(\Omega_0 z_0)^2}} \int_{z=z_1}^{z} \Omega \, dz = \pi \cdot n$$

Condition 2

$$\left[\frac{1}{2} \cdot \frac{1}{\Omega} \cdot \frac{d\Omega}{dz} + \frac{3}{2} \cdot \frac{1}{p} \cdot \frac{dp}{dz}\right]_{z=z_1} = \left[\frac{1}{2} \cdot \frac{1}{\Omega} \cdot \frac{d\Omega}{dz} + \frac{3}{2} \cdot \frac{1}{p} \cdot \frac{dp}{dz}\right]_{z}$$

In this case $\Omega$ is equal to the phase oscillation frequency. The phase oscillation frequency is given by the time which is needed to rotate the bunch in the phase space by an angle of 360°. All conditions are formulated under the special assumed condition 3, that $\Omega = \Omega_0 \cdot z_0/z$, where $\Omega_0 z_0$ is a constant:

Condition 3

$$\Omega^2 = \frac{2\pi e \cdot F \cdot f_B \cdot m \cdot c}{p^3} \cdot \sin \phi_s - \frac{3}{4} \cdot \frac{1}{p^2} \cdot \left(\frac{dp}{dz}\right)^2 - \frac{3}{2} \cdot \frac{1}{p} \cdot \frac{d^2p}{d^2z}$$

Here $F = F(z)$ is the electric field strength in the preaccelerator and $\phi_s = \phi_s(z)$ is the phase between the center of mass of pulse 7 and the high frequency wave in the preaccelerator 2 while $z$ is the coordinate along the main axis of FIG. 1. Furthermore, $n$ is an odd integer and $p = p(z)$ is the pulse of the particles. $p$ is the relativistic particle momentum and is measured in Nsec. $e$ and $m$ are the unit charge and mass of an electron and $c$ is the velocity of light.

In condition 1, $z = z_1$, $z_1$ being the location of the input 5 of preaccelerator 2, must be integrated up to $z$, the location of the output 18 of the preaccelerator 2. Condition 2 indicates that the differential equation stated in brackets must be met for the injection into the discharge from the preaccelerator 2.

The main accelerator 3 is so dimensioned that the center of mass of the pulses 7, shown schematically in FIG. 1 between preaccelerator 2 and main accelerator 3, is injected with zero phase relative to the maximum of the accelerator wave in the main accelerator 3. Also, the length of the main accelerator 3 must be dimensioned so that the particles (pulse 7) which deviate in energy at the point of injection 19 will be less accelerated by exactly the difference between their energy and that of the particles with minimum energy.

Figure 2C:
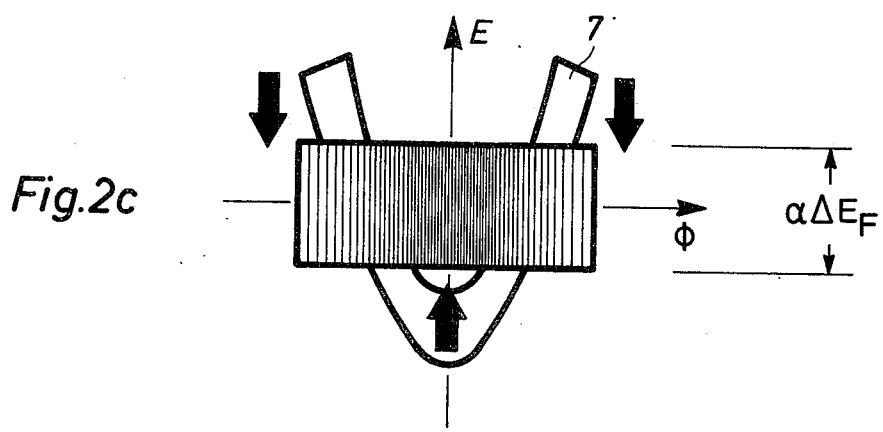

The particles thus all have the same energy at the output 20 of the main accelerator 3, independent of phase $\phi$. This is shown in FIG. 2c. The distribution of the energy E in the beam is determined only by the energy distribution of the electrons emanating from source 1. The average width $\alpha\Delta E$ is increased by about the factor 2. For reasons of clarity, pulse 7 is again shown with additional arrows which indicate the direction of deformation of pulse 7.

The condition which must be met for extending the distribution in the main accelerator 3, is listed here below as condition 4.

Condition 4

$$E_M \left[\frac{f_Q}{f_B}\right]^2 \cdot \alpha^3 \cdot E_Q$$

Here $E_M$ is the gain in energy in the main accelerator 3, $E_Q$ is the gain in energy in source 1, $f_Q$ is the operating frequency of the source 1, $f_B$ is the operating frequency of the preaccelerator 2 and of the main accelerator 3 and $\alpha^3$ is the preacceleration factor.

A not absolutely necessary but advantageous further condition 5

$$\left.\frac{1}{p} \cdot \frac{dp}{dz}\right|_{z=z_1} = \left.\frac{1}{p} \cdot \frac{dp}{dz}\right|_{z}$$

must be met in order to attain a minimum dependency on field errors at the input of preaccelerator 2 and at the output of the preaccelerator 2.

If all these conditions are met precisely, an electron beam can be obtained whose energy is increased up to 10 MeV and whose energy constancy or its directional be $m$ values, respectively, are extremely high.

FIG. 3 shows a simple high frequency field emission source 1 which can be used in the arrangement of FIG. 1. It includes two parts 9 and 10 which can be connected together. They enclose a recess 11 which serves as a resonator. Energy is fed in via inlet 12. On the raised bottom 13 of part 10, a field emission cathode 15 is centrally disposed on a rod 14. The field emission cathode 15 is placed a short distance away from the iris aperture 16. The energy coupled in through inlet 12 produces in cavity 11 a standing wave at a frequency of 24 GHz. The voltage maximum lies between the peaked, i.e., pointed, field emission cathode 15 and the opposite terminal 17 of the cavity 11. The thus produced electric field extracts electrons from cathode 15, which leave the iris aperture 16 as pulses 6 (see FIGS. 1 and 2a). The field emission source 1 is of the form as described in Appl. Phys. Letters 7, 11, 297 (1965), FIG. 3.

The preaccelerator and main accelerator are of the form as described in P. Lapostolle, A. Septier "Linear accelerator 1970", North Holland Publicing Company, Amsterdam.

The distance between the source and the preaccelerator as well as the distance between the preaccelerator and the main accelerator is calculated of the order of 1 to 2 centimeter.

It will be understood that the above description of the present invention is susceptible to various modifications, changes and adaptations, and the same are intended to be comprehended within the meaning and range of equivalents of the appended claims.

I claim:

1. A linear acceleration system for producing high energy electrons with high energy constancy values and directional beam values, comprising, in combination:
   high frequency field emission source means for producing pulsed electron beams at a predetermined frequency;
   preaccelerator means disposed for receiving the beams produced by said high frequency field emission source means and arranged to operate at an operating frequency which is less than the predetermined frequency of the pulsed electron beams for causing the electron distribution of each pulse to be shifted by a multiple of 180° with respect to phase during acceleration between the input and output of said preaccelerator means; and
   main accelerator means disposed for receiving the beams leaving the output of said preaccelerator means for accelerating the electrons by an amount dependent on the energy possessed thereby at the input to said main accelerator means such that the electrons whose energy deviates from the minimum electron energy at the input of said main accelerator means are accelerated less than are such minimum energy electrons by an amount determined by the magnitude of such deviation.

2. A system as defined in claim 1 wherein, for effecting such electron distribution shift with respect to phase, said preaccelerator means comprise means for injecting the centers of mass of the electron beam pulses into said preaccelerator means with a phase unequal to zero with respect to the wave maximum of the acceleration wave.

3. A system as defined in claim 1 further comprising means for injecting the centers of mass of the electron pulses from said preaccelerator means into said main accelerator means with a phase equal to zero relative to the maximum of the acceleration wave of said main accelerator means and wherein said main accelerator means are arranged to cause the electrons to maintain this phase.

4. A system as defined in claim 1 wherein said high frequency field emission source means operates at an operating frequency of 24 GHz.

5. A system as defined in claim 1 wherein said preaccelerator means and said main accelerator means operate at an operating frequency of 3 GHz.

6. A system as defined in claim 1 wherein said high frequency field emission source means, said preaccelerator means and said main accelerator means are provided with inner wall surfaces of superconductive material.

* * * * *